United States Patent
Schaffer et al.

(10) Patent No.: US 8,396,089 B2
(45) Date of Patent: Mar. 12, 2013

(54) DEVICE AND METHOD FOR IMPROVED SETTLING TIME IN MULTIPLEXED INPUT SYSTEMS

(75) Inventors: Viola Schaffer, Erlangen (DE); Heinz-Jürgen Metzger, Pliezhausen (DE); Michael V. Ivanov, Erlangen (DE)

(73) Assignee: Texas Instruments Deutschland GmbH, Freising (DE)

( * ) Notice: Subject to any disclaimer, the term of this patent is extended or adjusted under 35 U.S.C. 154(b) by 1082 days.

(21) Appl. No.: 12/359,653

(22) Filed: Jan. 26, 2009

(65) Prior Publication Data

US 2009/0196310 A1 Aug. 6, 2009

Related U.S. Application Data

(60) Provisional application No. 61/141,824, filed on Dec. 31, 2008.

(30) Foreign Application Priority Data

Jan. 28, 2008 (DE) .......................... 10 2008 006 435

(51) Int. Cl.
*H04J 3/02* (2006.01)
(52) U.S. Cl. ...................................................... 370/537
(58) Field of Classification Search .................. None
See application file for complete search history.

(56) References Cited

U.S. PATENT DOCUMENTS

| 4,163,940 A | * | 8/1979 | Brewerton | 324/132 |
| 6,803,555 B1 | * | 10/2004 | Parrish et al. | 250/214 C |
| 2004/0000841 A1 | * | 1/2004 | Phelps et al. | 310/314 |

* cited by examiner

*Primary Examiner* — Kevin C Harper
(74) *Attorney, Agent, or Firm* — Alan A. R. Cooper; Wade J. Brady, III; Frederick J. Telecky, Jr.

(57) ABSTRACT

An acquisition device and corresponding method for operating the acquisition system are provided. Generally, during operation a plurality of input signals are filtered and multiplexed. The multiplexed input signals are then applied to an amplifier stage; however, when a clamping condition for the amplifier stage occurs, a buffer is switched into a signal path between a multiplexer and an amplifier stage so as to generally reduce the current draw on the input filters.

15 Claims, 2 Drawing Sheets

DEVICE AND METHOD FOR IMPROVED SETTLING TIME IN MULTIPLEXED INPUT SYSTEMS

CROSS-REFERENCE TO RELATED APPLICATIONS

This application claims priority to German Patent Application No. 10 2008 006 435.1, entitled "DEVICE AND METHOD FOR IMPROVED SETTLING TIME IN MULTIPLEXED INPUT SYSTEMS," which was filed on Jan. 28, 2008, and this application claims priority to U.S. Provisional Patent Application Ser. No. 61/141,824, entitled "DEVICE AND METHOD FOR IMPROVED SETTLING TIME IN MULTIPLEXED INPUT SYSTEMS," filed on Dec. 31, 2008. Each of these applications is hereby incorporated by reference for all purposes.

TECHNICAL FIELD

The invention relates generally to an electronic device and, more particularly, to an acquisition system.

BACKGROUND

Referring to FIG. 1 of the drawings, the reference numeral 100 generally designates a typical configuration of a signal acquisition system. There are multiple channels or multiplexer inputs CH1 to CHx having or coupled to respective input pins S1 to Sx. A filter 102 to 108 is coupled to each of the channels CH1 to CHx for filtering the input signals, which are received through pins S1 through Sx. The filters 102 to 108 each pass relevant signals to the measurement channel MC, which includes an amplifier stage 312. The multiplexer or Mux 310 allows the same measurement channel to be used for multiple input signals by switching the respective input through to the multiplexer output OUT. Thereby, the same electronic components of the measurement channel MC can be used for each channel CH1 to CHx. This is typically accomplished by a differential amplifier 114, as shown in FIG. 1. In order to protect the amplifier 114 from dynamic and static overload condition a clamping stage 116 is present in almost all commercially available, e.g., high voltage, amplifiers. This clamping stage 116 is activated if a clamping condition occurs, e.g., if the output signal of the multiplexer changes suddenly from one input signal to another, suddenly placing a large and potentially damaging differential voltage across the amplifier differential inputs. However, the activation of the input clamp protection 116 draws a substantial amount of current from the filters 102 to 108. This current has to be compensated (e.g., by the signal source). This can cause a long settling of the voltage at multiplexer output OUT, which limits the system's settling time and the overall signal throughput. The situation is further illustrated in FIG. 2.

As shown in FIG. 2, the multiplexer output voltage OUT is switched from a first signal from channel CH1 to a second signal from channel CH2. The two signals have a large difference of potentials. This causes the input clamp protection 116 at the amplifier stage 112 to be activated. Therefore, a large current into the protection clamp 116 is drawn at the input of the measurement channel MC. This current is supplied by the input filter 104. The filter recharge rate and the settling time depend on the filter characteristic and architecture as well as on the input signal characteristics. Due to the filter's influence, the error from the ideal value, which is the difference between the ideal and the actual OUT becomes significant as shown in FIG. 2. In order to overcome these problems, prior art solutions, which are conceived to minimize the settling time, rely basically on using smaller filters. Other solutions use designated channels as reference channels, to which the multiplexer 110 switches between each change from a first channel CH1 to a second channel CH2 and vice-versa. This provides that the starting point for each measurement is known. However, use of a reference channel increases complexity of the switching and of the circuit as such.

SUMMARY

According to an embodiment of the invention an electronic device is provided, which includes a first channel having a first input for inputting a first signal and a first filter coupled to the first input for filtering the first input signal. There is also a second channel having a second input for inputting a second signal and a second filter coupled to the second input for filtering the second input signal. There is a multiplexer coupled to an output of the first filter and to an output of the second filter for selectively outputting the output signal of the first filter or the output signal of the second filter through a multiplexer output in response to a multiplexer configuration signal. Furthermore, there is an amplifier coupled with an input to the multiplexer output for receiving the multiplexer output signal, and a clamping stage coupled between the multiplexer output and the amplifier input for clamping the amplifier input if a clamping condition of the multiplexer output signal occurs. According to an embodiment of the invention, a buffer stage or plurality of buffers is coupled between the multiplexer output and the amplifier input. The buffer stage is adapted to be switched into the signal path during an event that would cause the input protection clamping stage to be activated. Buffer can be switched with an input into the signal path, such that the input signal has to run through buffer instead of running directly to amplifier input. A clamping condition or event can be a large potential change at the multiplexer output signal due to switching between channels. The buffer can limit the rate of the signal change at the input of the amplifier. It can also provide the input protection clamping stage with the necessary current while reducing high currents being drawn from the input filters. The buffer can also provide that the currents drawn by the input protection clamping stage are drawn from the voltage supply of the buffer but not from the filter. The buffer can be designed without an input protection clamping stage and can be simple and low precision, as it can remain in the signal path during the slewing to provide any current that the protection clamps draw. The desired result is that approximately no current is drawn from the input; therefore, the filters are generally not recharged. The ESD (Electrostatic Discharge) protection, which is typically present in the input pins of integrated electronic devices, is also not bypassed through the buffer stage. The input protection clamping stage for the amplifier is implemented in addition to the ESD structures. This aspect of the invention provides that the electronic device according to the present invention complies with ESD requirements.

An advantageous aspect of the invention is that the accuracy of the buffers, as for example offset, noise, etc., is not generally relevant as the buffer is only temporarily in the signal path. This allows lower precision high voltage transistors, large resistors, single ended structures, and so forth to be used in the buffer, which cannot be used in the high precision main amplifiers. The buffer generally includes a high voltage MOSFET transistor as an input transistor (i.e., typically the differential input stage would be implemented with high voltage MOSFET transistors), which can withstand the whole relevant input voltage range. In particular, the buffer should generally comprise MOSFETs at the input stage, which have a greater voltage range than the amplifier stage. Furthermore, this flexibility allows the buffers to be designed without for protecting their inputs with input protection clamping stages as those used for the amplifiers. However, the slew rate of the buffer can be highly relevant and should be designed with care. If the buffer is designed such that it has a slew rate that is just slightly slower than the slew rate of the main amplifier, then the main amplifier will generally not need to slew, and theoretically, there is no need for the input protection clamping stage. If a clamping stage is used, then the buffer will need to be able to provide enough current for the input clamping stage, while the clamping stage is activated. The circuitry according to an embodiment of the invention can be either single ended or fully differential.

In accordance with an embodiment of the invention, the input protection clamping stage is a voltage clamp, so voltages larger than the clamp voltage result in a current drawn from the input filters. Normally or ideally, an amplifier expects a limited bandwidth and slew-rate of its input signal. However, a signal multiplexer produces a very fast signal step causing dynamic overload and consequently the clamping stage will conduct current. Furthermore, switching the gain is another source of dynamic overload. Some applications do not provide sufficient signal bandwidth filtering and the amplifier may be dynamically overloaded, which activates the clamping stage. Therefore, an embodiment of the present invention generally overcomes problems relating to multiplexing and gain switching. For continuous signal acquisition, an embodiment of the invention will still produce a certain signal distortion due to the inaccuracy of the buffer stage, and finite activation delays. Yet, the electronic device according to an embodiment of the invention will reduce errors due to the current drawn by the clamping stage to a large degree.

According to an advantageous aspect of the present invention, the electronic device can also include a detection and control stage adapted to detect a clamping condition and to issue a control signal to the buffer stage for switching the buffer stage into the signal path. The control stage is adapted to issue the control signal to the buffer stage (i.e., to activate the buffer stage) just long enough to prevent current being drawn from the input filters while a clamping condition exists. Thereafter, the buffer stage is deactivated and switched out of the signal path.

An embodiment of the invention can also relate to a method for operating an acquisition system. The signal processing system has multiple input channels with filters and a measurement channel including an amplifier. The amplifier is protected by an input protection clamping stage at the input of the measurement channel (or at the input of the amplifier) and the measurement channel is to be multiplexed between the input channels. The input signals or the input signal of the measurement channel or system events are then monitored so as to either anticipate or to detect a clamping condition of the input signal. If the clamping condition is detected or anticipated, a buffer stage is switched into the signal path, preventing the input protection clamping stage from drawing current from the input filter. The activation of the buffer stage performed only for a predetermined (and limited) period of time which is chosen based on measurement channel characteristics to be long enough to avoid current being drawn from the filter. The length of the period of time during which the buffers are switched in the path is typically dependent on the amplifier slew rate and overload recovery characteristics in the measurement channel.

The clamping condition can be any specific signal behavior that would cause the input protection clamping stage to be activated. In certain cases clamping conditions can be anticipated from system events or a detection and control stage can be implemented that monitors the multiplexer output voltage. If the output voltage of the multiplexer exceeds a predetermined slew rate, the buffer stage (or multiple buffer stages if necessary) are switched automatically in the signal path for the duration of the event. The control stage can be adapted to automatically activate the buffer stage, if the slew rate of the output signal of the multiplexer exceeds a maximum slew rate. In a different embodiment, the control stage may only issue a signal indicating that the clamping condition is met. This signal can then be further processed so as to set specific conditions for the circuitry in order to handle the situation.

Additionally, an embodiment of the present invention also provides an apparatus. The apparatus comprises a plurality of input pins; a plurality of filters, wherein each filter is coupled to at least one of the input pins; a multiplexer having a plurality of multiplexer inputs and a plurality of multiplexer outputs, wherein each multiplexer input is coupled to at least one of the filters; an amplifier stage that is coupled to each multiplexer output forming a signal path for each multiplexer output, wherein the amplifier stage includes a clamp that is adapted to clamp at least one of the multiplexer outputs; a plurality of buffers, wherein each buffer is coupled between at least one of the multiplexer outputs and the amplifier stage; a plurality of switches, wherein at least one of the switches is coupled between each buffer and the amplifier stage; and a controller that is coupled to the multiplexer and each of the switches, wherein the controller is adapted to actuate each of the switches coupled between its corresponding buffer and the amplifier stage so as to switch the corresponding buffer into one of the signal paths when a clamping condition occurs.

In accordance with an embodiment of the present invention, the plurality of switches further comprises a plurality of first switches, wherein each switch is coupled between at least one of the multiplexer outputs and the amplifier stage; a plurality of second switches, wherein each second switch is coupled between at least one of the multiplexer outputs and at least one of the buffers; and a plurality of third switches, wherein each third switch is coupled between at least one of the buffers and the amplifier stage, and wherein each third switch is adapted to be actuated by the controller.

In accordance with an embodiment of the present invention, the amplifier stage further comprises a plurality of amplifiers, wherein each amplifier has a plurality of amplifier inputs, and wherein each amplifier is coupled to at least one of the signal paths; and a plurality of clamps, wherein each clamp is coupled to at least one of the amplifiers, wherein each clamp is adapted to clamp its corresponding amplifier inputs when the clamping condition occurs.

In accordance with an embodiment of the present invention, the clamping condition further comprises a corresponding multiplexer output exceeding a predetermined slew rate.

In accordance with an embodiment of the present invention, each buffer further comprises an input MOSFET transistor that is adapted to be used over a greater input voltage range than the amplifier stage.

In accordance with an embodiment of the present invention, the controller is coupled to an external pin, wherein the controller is adapted to receive an external signal that is representative of the clamping condition.

In accordance with an embodiment of the present invention, the apparatus further comprises a detection stage that is coupled to the controller, wherein the detection stage monitors the multiplexer outputs and provides a control signal to the controller that is representative of the clamping condition.

In accordance with an embodiment of the present invention, an apparatus is provided. The apparatus comprises a plurality of input pins; a plurality of filters, wherein each filter is coupled to at least one of the input pins; a multiplexer having a plurality of multiplexer inputs and a multiplexer output, wherein each multiplexer input is coupled to at least one of the filters; a first switch that is coupled to the multiplexer output; a second switch that is coupled to the multiplexer output; a buffer having a buffer input and a buffer output, wherein the buffer input is coupled to the second switch; a third switch that is coupled to the buffer output; an amplifier having a first amplifier input and a second amplifier input, wherein the first amplifier input is coupled to first switch and to the third switch; a clamp that is coupled to the first amplifier input and to the second amplifier input; and a controller that is coupled to the multiplexer, the first switch, the second switch, and the third switch, wherein the controller provides control signals to each of the first, second, and third switches so as to switch the buffer into a signal path of the multiplexer output when a clamping condition occurs.

In accordance with an embodiment of the present invention, a method for operating an acquisition system is provided. The method comprises filtering a plurality of input signals; multiplexing the plurality of input signals by a multiplexer; applying the multiplexed input signals to an amplifier stage; and switching a buffer into a signal path between a multiplexer and an amplifier stage when a clamping condition for the amplifier stage occurs.

In accordance with an embodiment of the present invention, the step of switching further comprises deactuating a first switch between the multiplexer and the amplifier stage; actuating a second switch between the multiplexer and the buffer; and actuating a third switch between the buffer and the amplifier stage.

In accordance with an embodiment of the present invention, the method further comprises the steps of receiving an external signal representative of the clamping condition by a controller; and providing a control signal to a switch between the buffer and the amplifier stage when the clamping condition occurs.

In accordance with an embodiment of the present invention, the method further comprises the steps of detecting the clamping condition receiving a signal representative of the clamping condition by a controller upon detection of the clamping condition; and providing a control signal to a switch between the buffer and the amplifier stage when the clamping condition occurs.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
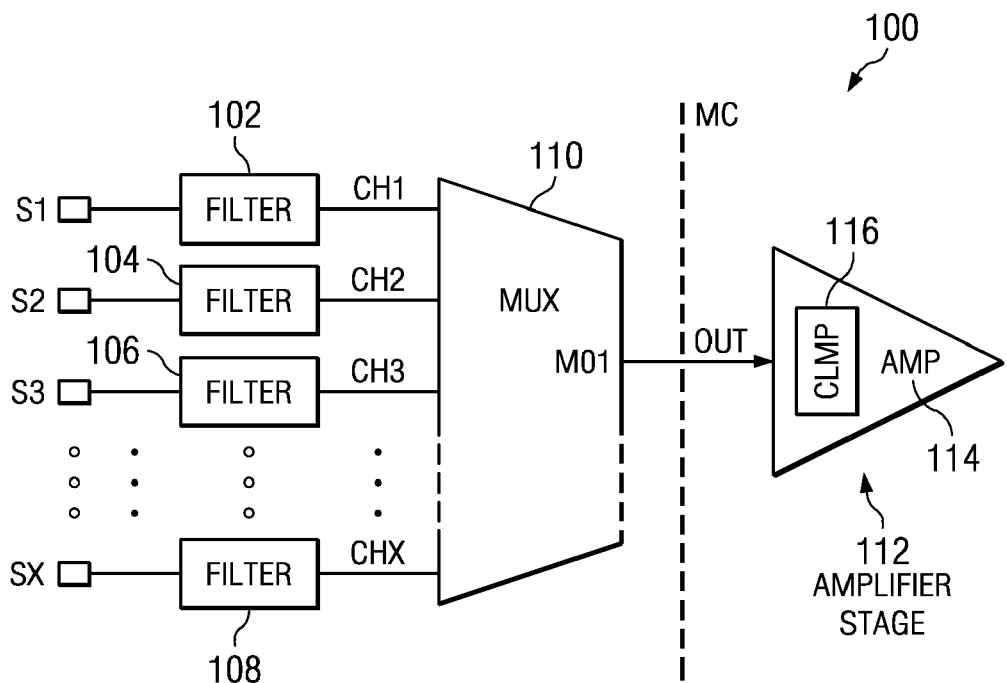
FIG. 1 is a simplified circuit diagram of a conventional acquisition system.
Figure 2:
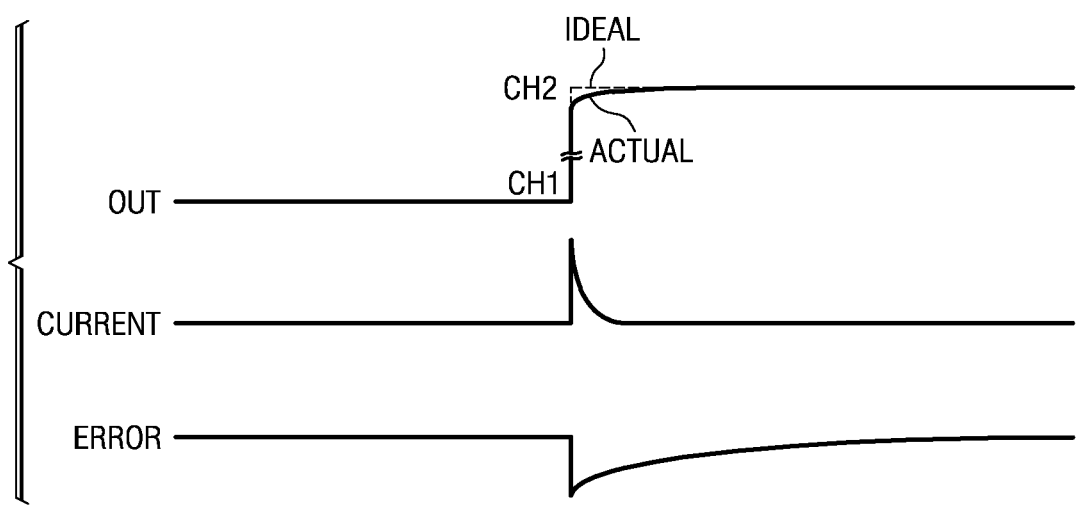
FIG. 2 depicts waveforms relating to the acquisition system of FIG. 1.

Refer now to the drawings wherein depicted elements are, for the sake of clarity, not necessarily shown to scale and wherein like or similar elements are designated by the same reference numeral through the several views.

Figure 3:
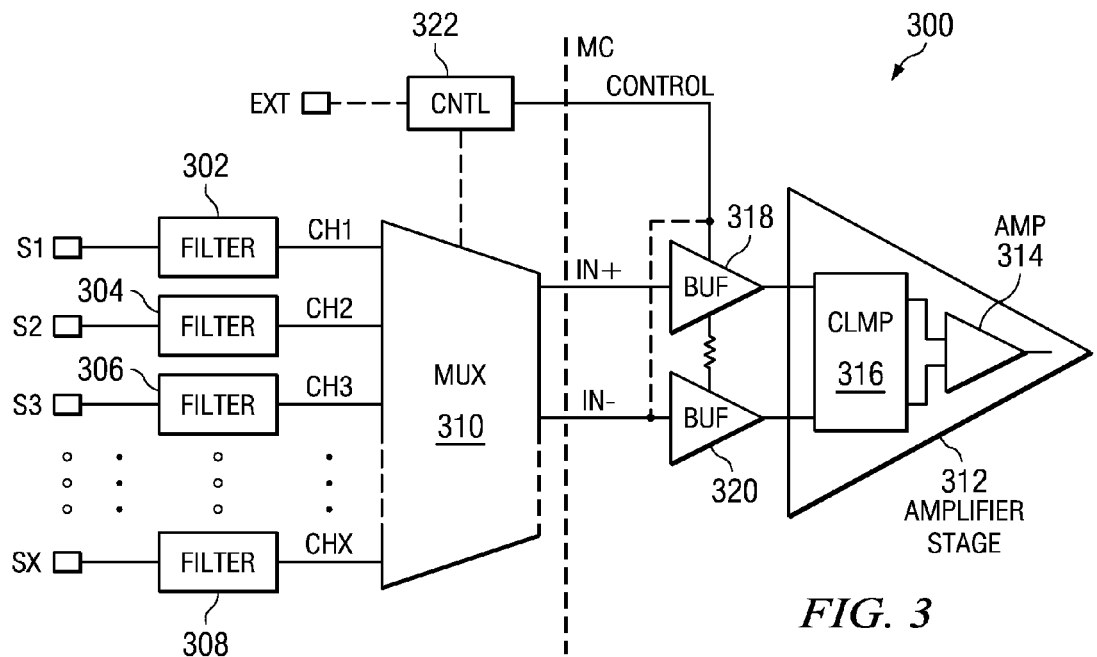
FIG. 3 is a simplified block diagram of an acquisition system in accordance with an embodiment of the invention.

Referring to FIG. 3 of the drawings, the reference numeral 300 generally designates an acquisition system in accordance with an embodiment of the invention. The various input signals received through input pins S1 to Sx are filtered by filters 302 to 308. The input filters 302 to 308 are coupled channels or inputs CH1 to CHx of multiplexer 310. The signals from channels CH1 to CHx are multiplexed by the multiplexer 310 to a measurement channel MC that includes an amplifier stage 312.

The amplifier stage is generally comprised of amplifier 314 and clamp stage 316. The input protection clamping stage 316 precedes the amplifier 314 in order to protect the inputs of the amplifier 314. The configuration shown in FIG. 3 relates to a fully differential implementation, but the present invention can equally be applied to a single ended or asymmetric architecture. Additionally, as can be seen in FIG. 4, the amplifier 314 is generally comprised of an amplifier 314A and 314B for each differential input or multiplexer output IN+ and IN−, and a clamps 316A and 316B is provided for each amplifier 314A and 314B.

Interposed between the amplifier stage 312 and the multiplexer 310 are buffers 318 and 320. Due to the fully differential architecture, there are two buffers, but a single buffer can be used in other configurations. Buffers 318 and 320 are generally coupled between clamping stage 316 and the multiplexer 310. A control signal CONTROL is issued to the buffers 318 and 320, if a clamping condition occurs due to a switching activity of multiplexer 310, and the buffers 318 and 320 are activated. These buffers 318 and 320 generally provide high impedance input stages, and they are coupled with their high impedance input pins to the output of the multiplexer 310. The outputs of the buffers 318 and 320 are coupled to the input of the amplifier stage 312. Accordingly, the buffers 318 and 320 can be switched into the respective signal paths. One reason for having high impedance inputs for buffers 318 and 320 is that the current drawn from any one of filters 302 to 308 by an activated input protection clamping stage 316 is generally avoided. When the clamping condition is over, the control signal CONTROL deactivates buffers 318 and 320 and the normal signal paths can be used. The time during which the buffers 318 and 320 are switched into the signal path is long enough to generally prevent current from being drawn from the input filters 302 to 308 and is typically determined by measurement channel MC characteristics such as slew rate and overload recovery times of the amplifier 314.

Figure 4:
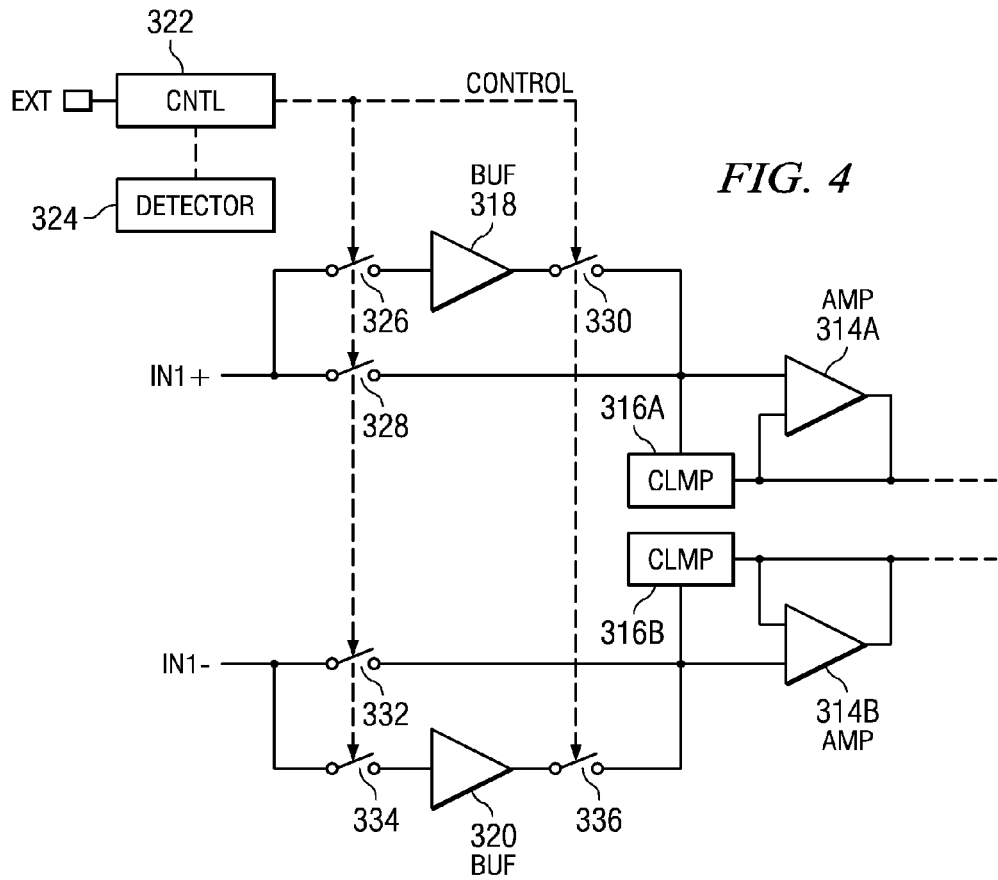
FIG. 4 is another a simplified circuit diagram of an acquisition in accordance with an embodiment of the invention.

Now turning to FIG. 4 of the drawings, the configuration of the buffers 318 and 320 and amplifier stage 312 can be seen in greater detail. Preferably, FIG. 4 shows a circuit diagram relating to a possible configuration for a fully differential architecture; however, a corresponding single ended architecture could also be derived from FIG. 4. Typically, the signals received are symmetric signals, and switches 326 to 336 are provided for switching the buffers 318 and 320 in and out of the signal path. The controller 332 is adapted to anticipate or detect a clamping condition for the clamps 316A and 316B provided close to the inputs of the amplifiers 314A and 314B. Preferably, the controller 322 can either receive an external signal through an external pin EXT, which is representative of a clamping condition; or the controller 322 can monitor the switching of the multiplexer 310 (which can be done through the use of a detector 324); or the controller 322 can survey the behavior of the input signals either at the multiplexer outputs IN1+ and IN1− or somewhere else in the system (which can be done through the use of a detector 324).

Under circumstances where a clamping condition occurs, the controller 322 operates place the buffers 318 and 320 into their respective signal paths. Preferably, when a clamping condition is indicated, the controller 322 may issue a control signal CONTROL for switching the buffers 318 and 320 into the signal path and disconnecting the normal signal path by closing switches 326, 330, 334, and 336 and opening switches 328 and 332. When the clamping condition is over, which means that the signal transition at the relevant point in the system (e.g., at input pins IN1+ and IN1−) below a predetermined threshold, the buffers 318 and 320 are switched out of their signal paths by opening (i.e., disconnecting) switches 326, 330, 334, and 336 and closing switches 328 and 332. In order to save power, the buffers 318 and 320 can be deactivated, if no clamping condition occurs, i.e., during normal operation.

The conditions according to which the buffers 318 and 320 are activated and switched into their respective signal paths are multifold. One instance can occur when the signal at outputs IN1+ and IN1− or somewhere else in the system is monitored, the controller 322 can, for example, be adapted to determine the slew rate of the signal. If a predetermined slew rate (which can preferably be based on the maximum slew rate of the amplifiers 314A and 314B) is exceeded, then the buffers 318 and 320 can be activated and switched into their respective signal paths. In another instance, the controller 322 can receive a configuration signal from the multiplexer 310, which indicates that the multiplexer is switched or will be switched soon. The controller 322 may then activate and switch the buffers 318 and 320, for example, as a precautionary measure by anticipating a clamping condition rather than detecting a clamping condition that already occurred. In yet another instance, the controller 322 can be adapted to monitor the input signals, for example at the input pins S1 to Sx, and if two signals which are to be multiplexed to the measurement channel MC have properties which may cause a clamping condition to occur, then the controller 322 could issue activate and switch the buffers 318 and 320. Generally, the monitoring the signals in the system rather than at the outputs IN+ and IN− allows a greater safety margin in terms of time to be established before the clamping condition will actually occur at the clamping stage 316.

Moreover, the accuracy of the buffers 318 and 320 (i.e., offset, noise, etc.) is not relevant as the buffer 318 and 320 are only temporarily in the signal paths. This enables the use of lower precision high voltage transistors, large resistors, single ended structures, and so forth, which are not generally used in the amplifiers 314A and 314B. This flexibility allows the buffers 318 and 320 to be designed without the need for protecting their inputs with clamping stages or clamps (similar to clamps 316A and 316B).

The slew rates of the buffers 318 and 320, though, are generally relevant. If the buffers 318 and 320 are designed such that each of the buffers 318 and 320 has a slew rate that is just slightly slower than the slew rate of the amplifiers 314A and 314B, then the amplifiers 314A and 314B will generally not need to slew, and theoretically, there is generally no need for the input clamps 316A and 316B. Additionally, if clamping stage 316 is used, then the buffers 318 and 320 should to be able to provide enough current for the input clamps 316A and 316B while the clamping stage 316 is activated.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a plurality of input pins;
    a plurality of filters, wherein each filter is coupled to at least one of the input pins;
    a multiplexer having a plurality of multiplexer inputs and a plurality of multiplexer outputs, wherein each multiplexer input is coupled to at least one of the filters;
    an amplifier stage that is coupled to each multiplexer output forming a signal path for each multiplexer output, wherein the amplifier stage includes a clamp that is adapted to clamp at least one of the multiplexer outputs;
    a plurality of buffers, wherein each buffer is coupled between at least one of the multiplexer outputs and the amplifier stage;
    a plurality of switches, wherein at least one of the switches is coupled between each buffer and the amplifier stage; and
    a controller that is coupled to the multiplexer and each of the switches, wherein the controller is adapted to actuate each of the switches coupled between its corresponding buffer and the amplifier stage so as to switch the corresponding buffer into one of the signal paths when a clamping condition occurs.

2. The apparatus of claim 1, wherein the plurality of switches further comprises:
    a plurality of first switches, wherein each switch is coupled between at least one of the multiplexer outputs and the amplifier stage;
    a plurality of second switches, wherein each second switch is coupled between at least one of the multiplexer outputs and at least one of the buffers; and
    a plurality of third switches, wherein each third switch is coupled between at least one of the buffers and the amplifier stage, and wherein each third switch is adapted to be actuated by the controller.

3. The apparatus of claim 1, wherein the amplifier stage further comprises:
    a plurality of amplifiers, wherein each amplifier has a plurality of amplifier inputs, and wherein each amplifier is coupled to at least one of the signal paths; and
    a plurality of clamps, wherein each clamp is coupled to at least one of the amplifiers, wherein each clamp is adapted to clamp its corresponding amplifier inputs when the clamping condition occurs.

4. The apparatus of claim 1, wherein the clamping condition further comprises a corresponding multiplexer output exceeding a predetermined slew rate.

5. The apparatus of claim 1, wherein each buffer further comprises an input MOSFET transistor that is adapted to be used over a greater input voltage range than the amplifier stage.

6. The apparatus of claim 1, wherein the controller is coupled to an external pin, wherein the controller is adapted to receive an external signal that is representative of the clamping condition.

7. The apparatus of claim 1, wherein the apparatus further comprises a detection stage that is coupled to the controller, wherein the detection stage monitors the multiplexer outputs and provides a control signal to the controller that is representative of the clamping condition.

8. An apparatus comprising:
a plurality of input pins;
a plurality of filters, wherein each filter is coupled to at least one of the input pins;
a multiplexer having a plurality of multiplexer inputs and a multiplexer output, wherein each multiplexer input is coupled to at least one of the filters;
a first switch that is coupled to the multiplexer output;
a second switch that is coupled to the multiplexer output;
a buffer having a buffer input and a buffer output, wherein the buffer input is coupled to the second switch;
a third switch that is coupled to the buffer output;
an amplifier having a first amplifier input and a second amplifier input, wherein the first amplifier input is coupled to first switch and to the third switch;
a clamp that is coupled to the first amplifier input and to the second amplifier input; and
a controller that is coupled to the multiplexer, the first switch, the second switch, and the third switch, wherein the controller provides control signals to each of the first, second, and third switches so as to switch the buffer into a signal path of the multiplexer output when a clamping condition occurs.

9. The apparatus of claim 8, wherein the clamping condition further comprises the multiplexer output exceeding a predetermined slew rate.

10. The apparatus of claim 8, wherein the buffer further comprises an input MOSFET transistor that is adapted to be used over a greater input voltage range than the amplifier stage.

11. The apparatus of claim 8, wherein the controller is coupled to an external pin, wherein the controller is adapted to receive an external signal that is representative of the clamping condition.

12. The apparatus of claim 8, wherein the apparatus further comprises a detection stage that is coupled to the controller, wherein the detection stage monitors the multiplexer output and provides a control signal to the controller that is representative of the clamping condition.

13. A method for operating an acquisition system, the method comprising:
filtering a plurality of input signals;
multiplexing the plurality of input signals by a multiplexer;
applying the multiplexed input signals to an amplifier stage; and
switching a buffer into a signal path between a multiplexer and an amplifier stage when a clamping condition for the amplifier stage occurs by:
deactuating a first switch between the multiplexer and the amplifier stage;
actuating a second switch between the multiplexer and the buffer; and
actuating a third switch between the buffer and the amplifier stage.

14. A method for operating an acquisition system, the method comprising:
filtering a plurality of input signals;
multiplexing the plurality of input signals by a multiplexer;
applying the multiplexed input signals to an amplifier stage;
switching a buffer into a signal path between a multiplexer and an amplifier stage when a clamping condition for the amplifier stage occurs;
receiving an external signal representative of the clamping condition by a controller; and
providing a control signal to a switch between the buffer and the amplifier stage when the clamping condition occurs.

15. A method for operating an acquisition system, the method comprising:
filtering a plurality of input signals;
multiplexing the plurality of input signals by a multiplexer;
applying the multiplexed input signals to an amplifier stage;
switching a buffer into a signal path between a multiplexer and an amplifier stage when a clamping condition for the amplifier stage occurs;
detecting the clamping condition;
receiving a signal representative of the clamping condition by a controller upon detection of the clamping condition; and
providing a control signal to a switch between the buffer and the amplifier stage when the clamping condition occurs.

* * * * *